United States Patent
Lassar et al.

(10) Patent No.: US 7,211,736 B2
(45) Date of Patent: May 1, 2007

(54) CONNECTION PAD LAYOUTS

(75) Inventors: Noah Lassar, San Diego, CA (US); Mohammad Akhavain, Escondido, CA (US); Michael Martin, Dana Point, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 452 days.

(21) Appl. No.: 10/698,604

(22) Filed: Oct. 31, 2003

(65) Prior Publication Data

US 2005/0094382 A1  May 5, 2005

(51) Int. Cl.
*H05K 1/00* (2006.01)

(52) U.S. Cl. ............... 174/254; 174/261; 439/924.1

(58) Field of Classification Search ........ 361/767–779, 361/749–751; 174/206, 267, 254, 260, 261; 439/66, 74, 924.1, 924.2
See application file for complete search history.

(56) References Cited

U.S. PATENT DOCUMENTS

| 4,600,970 | A |  | 7/1986 | Bauer |
| 5,019,997 | A |  | 5/1991 | Haller |
| 5,315,485 | A |  | 5/1994 | Magill et al. |
| 5,324,569 | A |  | 6/1994 | Nagesh et al. |
| 5,375,041 | A | * | 12/1994 | McMahon ................. 361/749 |
| 5,381,307 | A |  | 1/1995 | Hertz et al. |
| 5,412,537 | A |  | 5/1995 | Magill et al. |
| 5,435,482 | A |  | 7/1995 | Variot et al. |
| 5,484,963 | A |  | 1/1996 | Washino |
| 5,641,946 | A |  | 6/1997 | Shim |
| 5,745,986 | A |  | 5/1998 | Variot et al. |
| 5,777,855 | A | * | 7/1998 | Yokajty ...................... 361/803 |
| 5,798,567 | A |  | 8/1998 | Kelly et al. |
| 5,951,304 | A |  | 9/1999 | Wildes et al. |
| 6,113,216 | A |  | 9/2000 | Wong |
| 6,422,688 | B2 |  | 7/2002 | Giere et al. |
| 6,452,112 | B1 | * | 9/2002 | Terashima et al. .......... 174/260 |
| 6,472,607 | B1 | * | 10/2002 | Someya et al. ............. 174/250 |
| 6,558,199 | B2 | * | 5/2003 | Oguchi ....................... 439/630 |
| 6,974,330 | B2 | * | 12/2005 | Caldwell et al. ............. 439/66 |
| 2001/0033017 | A1 | * | 10/2001 | Wang et al. ................ 257/698 |

* cited by examiner

*Primary Examiner*—Tuan Dinh
*Assistant Examiner*—Jeremy C. Norris

(57) ABSTRACT

In an implementation of connection pad layouts, a connection assembly includes a substrate assembly and connection pads disposed thereon. The connection pads form a configuration such that each connection pad is configured to align with a different terminal of an interconnect that is warped or otherwise has a non-linear alignment of terminals.

19 Claims, 4 Drawing Sheets

CONNECTION PAD LAYOUTS

TECHNICAL FIELD

This invention relates to connection assemblies and, in particular, to connection pad layouts.

BACKGROUND

FIG. 1 illustrates a top-view of a substrate assembly 100 and a conventional array 102 of connection pads 104 formed on the substrate assembly 100. The connection pads are typically laid out in an array 102 such that rows of the connection pads 104 are parallel and collinear. The connection pads 104 are disposed on an upper surface 106 of the substrate assembly 100 to form an electrical connection with thin film wiring formed on a surface of the substrate assembly 100, or with conductive vias formed within the substrate assembly 100.

The substrate assembly 100 can be formed as a ceramic substrate and implemented to electrically connect semiconductor integrated circuits and other electronic or microelectronic components. The integrated circuits and electronic components can be interconnected by way of conductive vias formed within layers of the ceramic substrate assembly 100.

Interconnect terminals of an integrated circuit or electronic component are soldered, or otherwise affixed with a conductive adhesive, to the connection pads 104 to electrically couple the integrated circuit or electronic component with conductive vias in the substrate assembly 100. Solder can be pre-formed on an interconnect terminal or on a connection pad 104 and can be reflowed (e.g., heated to a liquid) to provide a conductive bond that electrically couples an interconnect terminal with a respective connection pad 104. This provides an electrical signal communication path between an electronic component and a conductive via in the substrate assembly 100 (coupled through a connection pad 104).

FIG. 2 further illustrates the substrate assembly 100 (a top view) and the conventional array 102 of connection pads 104 shown in FIG. 1. A warped interconnect 200 is shown positioned over the connection pad array 102 to illustrate that interconnect terminals 202 of the warped interconnect 200 do not all align with the conventional array 102 of connection pads 104. The warped interconnect 200 is shown "transparent" such that the interconnect terminals 202 and the connection pads 104 are "viewable" through the interconnect 200. Further, FIG. 2 does not show the integrated circuit or electronic component that warped interconnect 200 would interface to the substrate assembly 100.

Although the interconnect terminals 202 at a mid-portion of the interconnect 200 do align with a respective connection pad 104, such as terminal 202(4) which aligns with connection pad 104(4), the terminals 202 at the ends of the warped interconnect 200 do not accurately align with a respective connection pad 104. For example, interconnect terminal 202(1) does not accurately align with connection pad 104(1), and interconnect terminal 202(N) also does not accurately align with a connection pad on the substrate assembly 100. These misaligned interconnect terminals and connection pads reduce the effectiveness of the electrical connections, and with some of the interconnect terminals, there is no electrical connection. In addition to the misaligned interconnect terminal 202(N) not having an established electrical connection with a respective connection pad, the misaligned interconnect terminal may overlap and electrically connect with the wrong connection pad, as shown in region 204.

Electronic devices continue to be manufactured smaller and/or more portable, yet increasingly are more complex and multi-functional which requires more electrical interconnections between components in the electronic devices. Substrate assemblies in these smaller electronic devices have limited available surface area for component interconnection, while at the same time, more electrical interconnections are needed to implement the many features that are available with these electronic devices. As a result, manufacturers utilize thin and elongated interconnects to electrically connect the components in an electronic device when available substrate surface space is at a premium.

When these thin and less rigid interconnects are manufactured, the interconnects tend to warp at one or both ends due to manufacturing inaccuracies, material variations, and/or non-uniform shrinkage of the material used to manufacture the interconnects. For example, differential shrinkage of multi-lead interconnects in a two-dimensional array occurs when a thin and long interconnect is fabricated with more coring on one end or the other resulting in non-uniform shrinkage on the end with more plastic or interconnect material. When the warped interconnect 200 is positioned over the connection pad array 102, not all of the interconnect terminals 202 accurately align with the respective connection pads 104 thus reducing the connection density, or manufacturing yields.

A conventional practice to ensure accurate alignment and electrical contact with the interconnect terminals of an electronic component is to oversize all of the connection pads. However, oversizing the connection pads to accommodate the worst case misalignment limits the number of connection pads that can be formed within the ever diminishing available substrate surface space, thus reducing and limiting the connection density.

BRIEF DESCRIPTION OF THE DRAWINGS

The same numbers are used throughout the drawings to reference like features and components.

DETAILED DESCRIPTION

In an embodiment of connection pad layouts, connection pads can be disposed on a substrate assembly in any number of configurations to accommodate any shape of an interconnect, such as an interconnect that is warped during manufacture for example. The connection pads can be laid out to align with interconnect terminals of warped interconnects without over-sizing or increasing the contact area of the connection pads, which maintains a high connection density. The exemplary connection pad configurations described herein provide that an interconnect having any layout of terminals (e.g., a warped interconnect) will be electrically coupled to conductive vias within a substrate assembly by contact between the interconnect terminals and one or more of the connection pads in a connection pad configuration.

Figure 1:
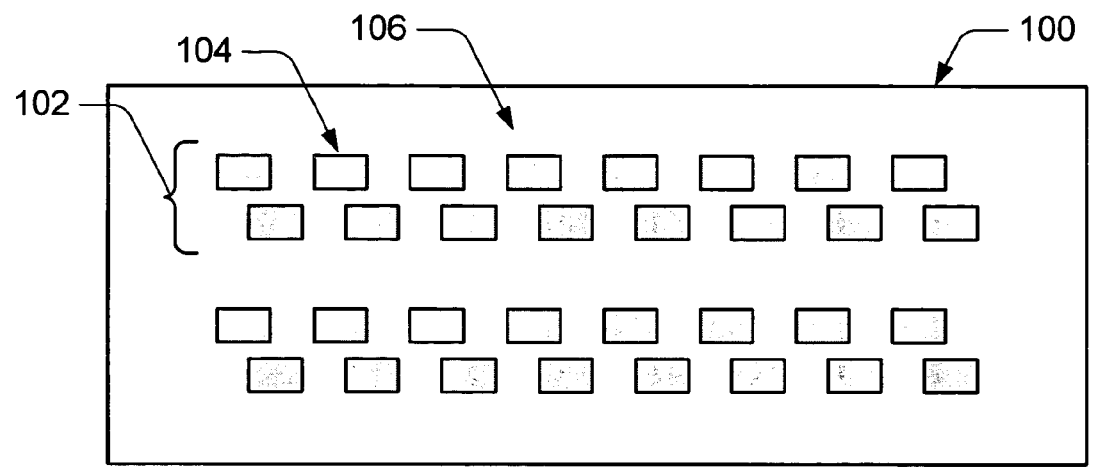
FIG. 1 illustrates a substrate and a conventional array of connection pads.
Figure 2:
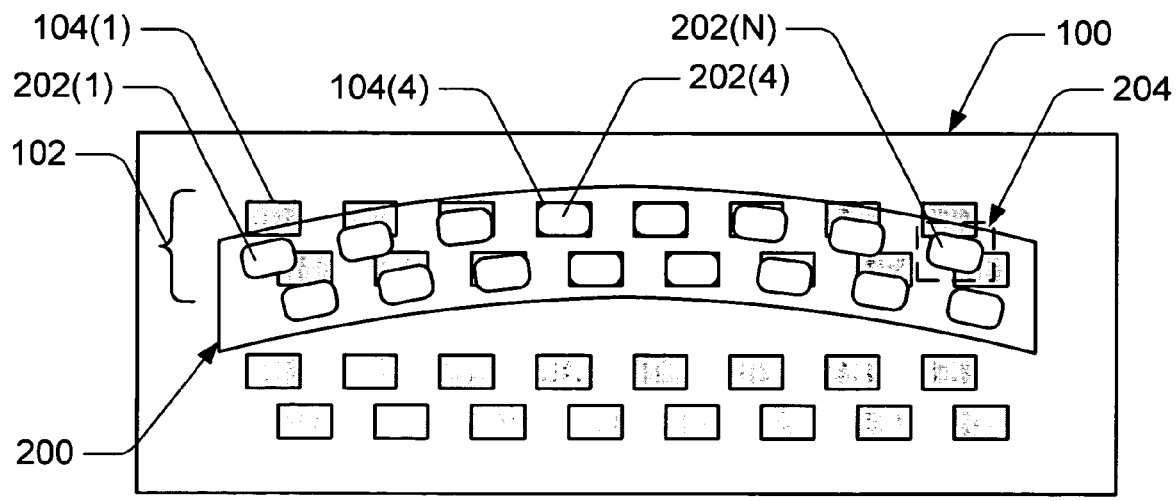
FIG. 2 illustrates the substrate and conventional array of connection pads shown in FIG. 1 where interconnect terminals of a warped interconnect do not accurately align with the conventional array of connection pads.
Figure 3:
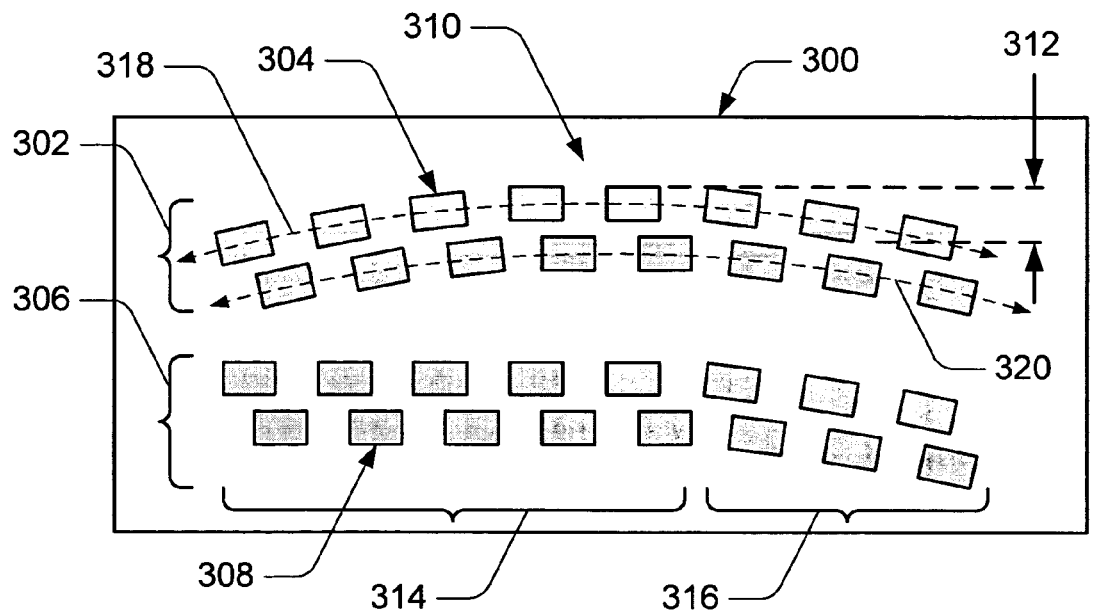
FIG. 3 illustrates an exemplary connection pad array for a warped interconnect according to one embodiment of connection pad layouts.

FIG. 3 illustrates a top-view of a substrate assembly 300 and an array 302 of connection pads 304 formed on the substrate assembly 300. The substrate assembly 300 also has an array 306 of connection pads 308 formed on the substrate assembly 300. The connection pads 304 and 308 are disposed on a surface 310 of the substrate assembly 300 to form an electrical connection with thin film wiring (not shown) formed on a surface of the substrate assembly 300, or with conductive vias (not shown) formed within the substrate assembly 300.

The substrate assembly 300 can be formed with layered sheets of substrate material such as alumina, glass ceramic aluminum nitride, laminated glass fibers and epoxy for a PC board, layers of polymide for a flex circuit, or any other type of substrate material. The layered substrate sheets can have conductive vias that are filled with a conductive material, plated or otherwise made conductive, to electrically connect each conductive via to a respective connection pad 304, 308. The connection pads 304 and 308, and the vias in substrate assembly 300, are multiple conductors which can be formed with such conductive material as tungsten, molybdenum, copper, conductive adhesive, brazing, or with any other type of conductive material.

Substrate assembly 300, which in one embodiment is a layered ceramic substrate, can be manufactured to electrically connect semiconductor integrated circuits and other electronic or microelectronic components, such as printing device components. The integrated circuits and electronic components can be connected by the conductive vias which may function as electrical interconnections and can be formed within the layers of the substrate assembly 300. The connection pads 304 and 308 can be part of circuitry disposed on the substrate assembly 300, or can be the connections for implementation within a larger circuit and/or electronic component.

In an embodiment, connection pads 304 are disposed on substrate assembly 300 in a configuration (e.g., connection pad array 302) with a warp variance 312 which in this example, is a distance that one or both ends of an interconnect are displaced from a center of the interconnect. In another embodiment, warp variance 312 can also be determined, or measured, as a distance from a center of the connection pad array 302. In an additional embodiment, a warp variance 312 can be described as one or more of the connection pads 304 having a center that is offset from a line in a direction parallel to a surface of the substrate assembly upon which the connections pads are disposed where the line is defined by a plane perpendicular to the surface of the substrate assembly. Other methods of measuring or determining warp variance may be utilized.

In the example shown in FIG. 3, connection pad array 302 is laid out such that the connection pads 304 each align with the terminals of an interconnect that is warped on both ends. Connection pad array 306 is laid out such that the connection pads 308 align with the terminals of an interconnect that is straight on one end (aligns with connection pads 308 in region 314) and that is warped on the other end (aligns with connection pads 308 in region 316). In another embodiment, connection pads 304 may be disposed in a configuration such that a line through a center of the connection pads 304 in a row 318, and a line through a center of the connection pads 308 in a row 320, is curvilinear or an arc.

The connection pad arrays 302 and 306 are only two examples of connection pad configurations that can be disposed on substrate assembly 300 to accommodate any shape of warped interconnects having any warp variance 312. The connection pads 304 and 308 are laid out to align with the terminals of warped interconnects without over-sizing or increasing the contact area of the connection pads to maintain a high connection density when mounting warped interconnect(s) on a substrate assembly.

Although only the two connection pad arrays 302 and 306 are shown having connection pads 304 and 308, respectively, any number of connection pad arrays which include any number of connection pads can be disposed on substrate assembly 300. Further, although the connection pads 304 and 308 are shown as rectangular pads, the connection pads can be implemented as any number of different shapes to align and coincide with any type of interconnect terminals. It should also be noted that the substrate assembly 300 and the connection pads 304 and 308 are only illustrative and are not shown to scale in the figures.

Figure 4:
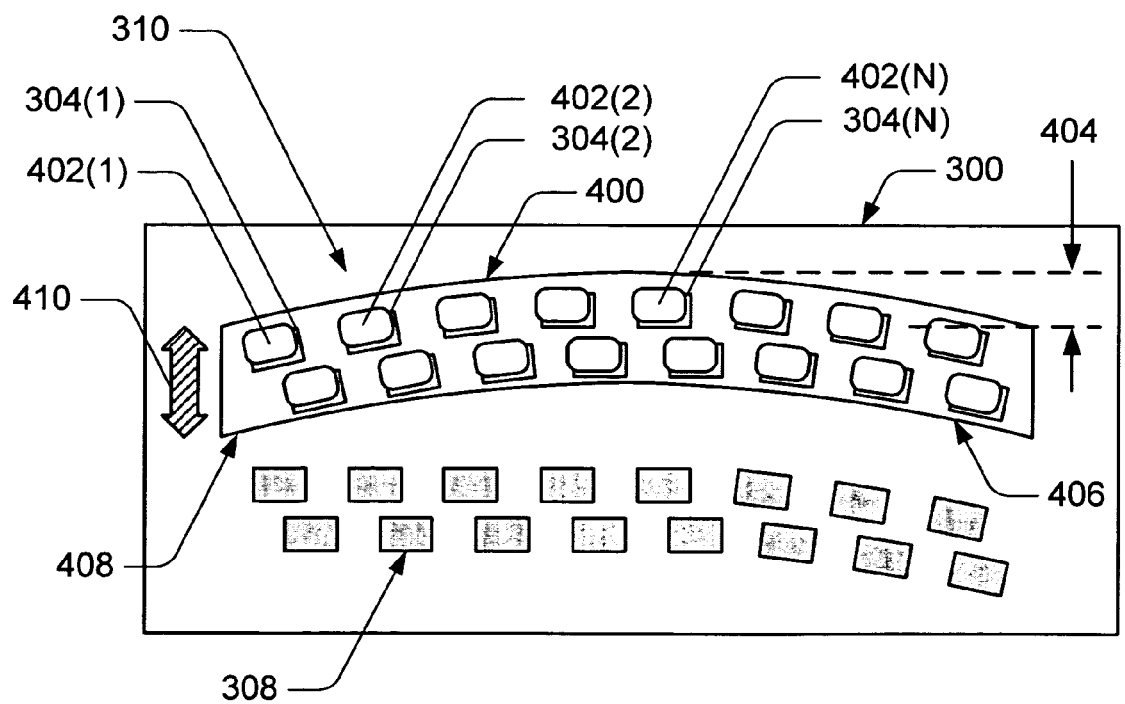
FIG. 4 further illustrates the exemplary connection pad array shown in FIG. 3 where the connection pads align with interconnect terminals of an interconnect according to one embodiment of connection pad layouts.

FIG. 4 illustrates the substrate assembly 300 and the connection pads 304 and 308 as shown in FIG. 3. A warped interconnect 400 is positioned over the connection pads 304 (e.g., connection pad array 302) such that interconnect terminals 402 of the warped interconnect 400 align with the connection pads 304. For example, interconnect terminal 402(1) aligns with a respective connection pad 304(1), interconnect terminal 402(2) aligns with a respective connection pad 304(2), and interconnect terminal 402(N) aligns with a respective connection pad 304(N).

A warp variance 404, in this example, is a distance that each of a first end 406 and a second end 408 of the warped interconnect 400 is displaced from a center of the interconnect 400 due to warping, such as during manufacture. The warp variance 404 substantially aligns with warp variance 312 (FIG. 3) which corresponds to the configuration layout of connection pad array 302 of the connection pads 304. The interconnect 400 is warped in a direction 410 that is parallel to the surface 310 of the substrate assembly 300 (the surface 310 being the substrate surface that connection pads 304 and 308 are disposed upon).

A particular substrate assembly can include any layout of connection pads to align with the interconnect terminals of any warped interconnect. For example, a substrate assembly can include connection pad arrays 302 and 306 to align with the terminals of an interconnect warped at both ends and an interconnect warped at only one end, respectively.

Figure 5:
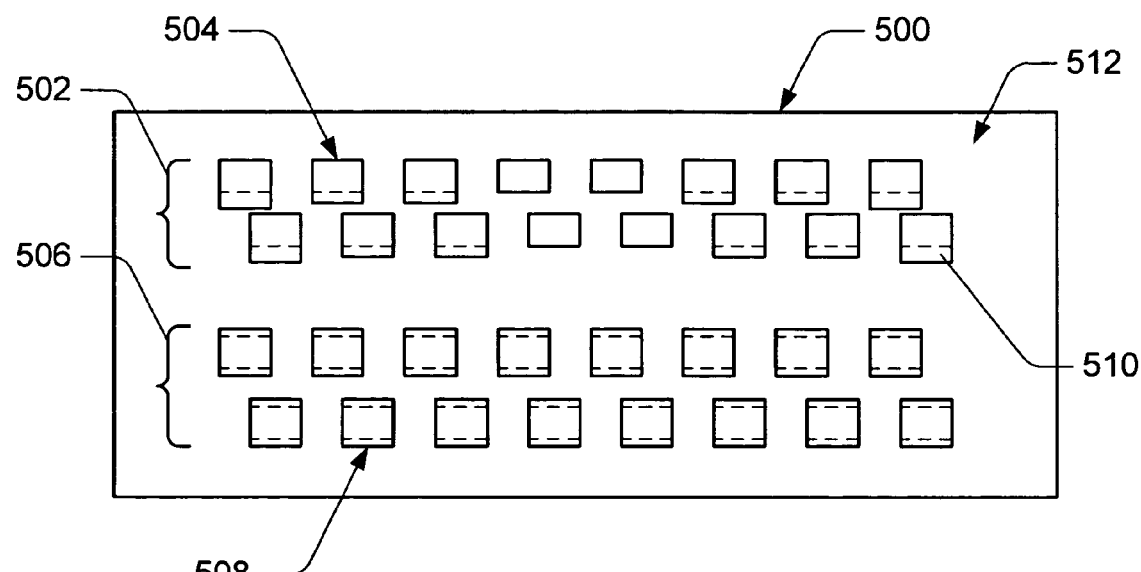
FIG. 5 illustrates an exemplary connection pad array having connection pads formed into a configuration to align with an interconnect according to one embodiment of connection pad layouts.
Figure 6:
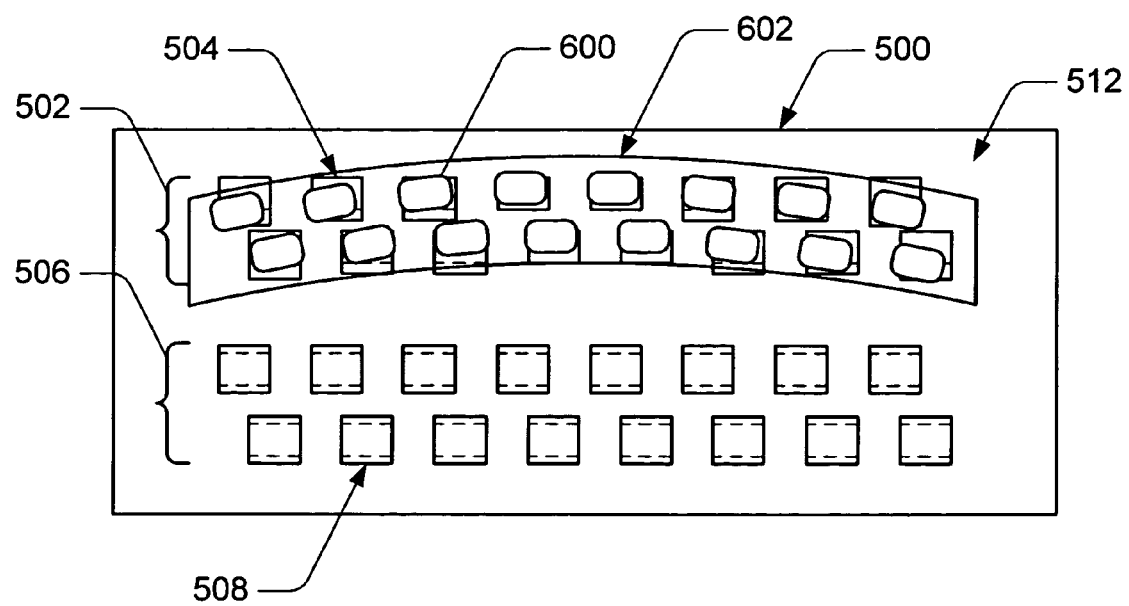
FIG. 6 further illustrates the exemplary connection pad array shown in FIG. 5 where the connection pads can align with interconnect terminals of a straight interconnect or can align with interconnect terminals of a warped interconnect according to one embodiment of connection pad layouts.

FIGS. 5 and 6 illustrate a top-view of a substrate assembly 500 and an array 502 of connection pads 504 formed on the substrate assembly 500. The substrate assembly 500 also includes an array 506 of connection pads 508 formed on the substrate assembly. Connection pads 504 are configured (e.g., disposed, or otherwise formed, on or in substrate assembly 500) to align with interconnect terminals 600 of a warped interconnect 602 (shown in FIG. 6). Connection pad array 502 includes one or more connection pads 504 that are extended on one side (e.g., in region 510) and which are configured to align with the interconnect terminals 600 of interconnect 602. In this example, the interconnect 602 is warped such that the centers of the interconnect terminals 600 are not in a same plane that is substantially normal to the surface of the interconnect 602 (e.g., the centers of the interconnect terminals 600 are not aligned horizontally along the array 502 of connection pads 504).

The connection pads 508 of connection pad array 506 are extended, or otherwise widened, on both sides to also align with the interconnect terminals of an interconnect (e.g., interconnect 702) which may be warped at one end, at both ends, or warped in some other area. Although all of the connection pads 508 are illustrated as being extended on both sides of the pads, any one or more of the connection pads 508 may be extended on one or both sides as applicable to accommodate a connection with an interconnect terminal of an interconnect. Further, any one or more of the connection pads 508 may be extended a distance less or greater than any other connection pad on one and/or both sides.

The connection pads 504 and 508 are disposed on a surface 512 of the substrate assembly 500 to form an electrical connection with thin film wiring (not shown) formed on a surface of the substrate assembly 500, or with conductive vias (not shown) formed within the substrate assembly 500. Connection pad arrays 502 and 506 allow an interconnect having any shape to be electrically coupled to conductive vias within the substrate assembly 500 by contact between the interconnect terminals and one or more of the connection pads 504 and 508 (e.g., using solder).

Figure 7:
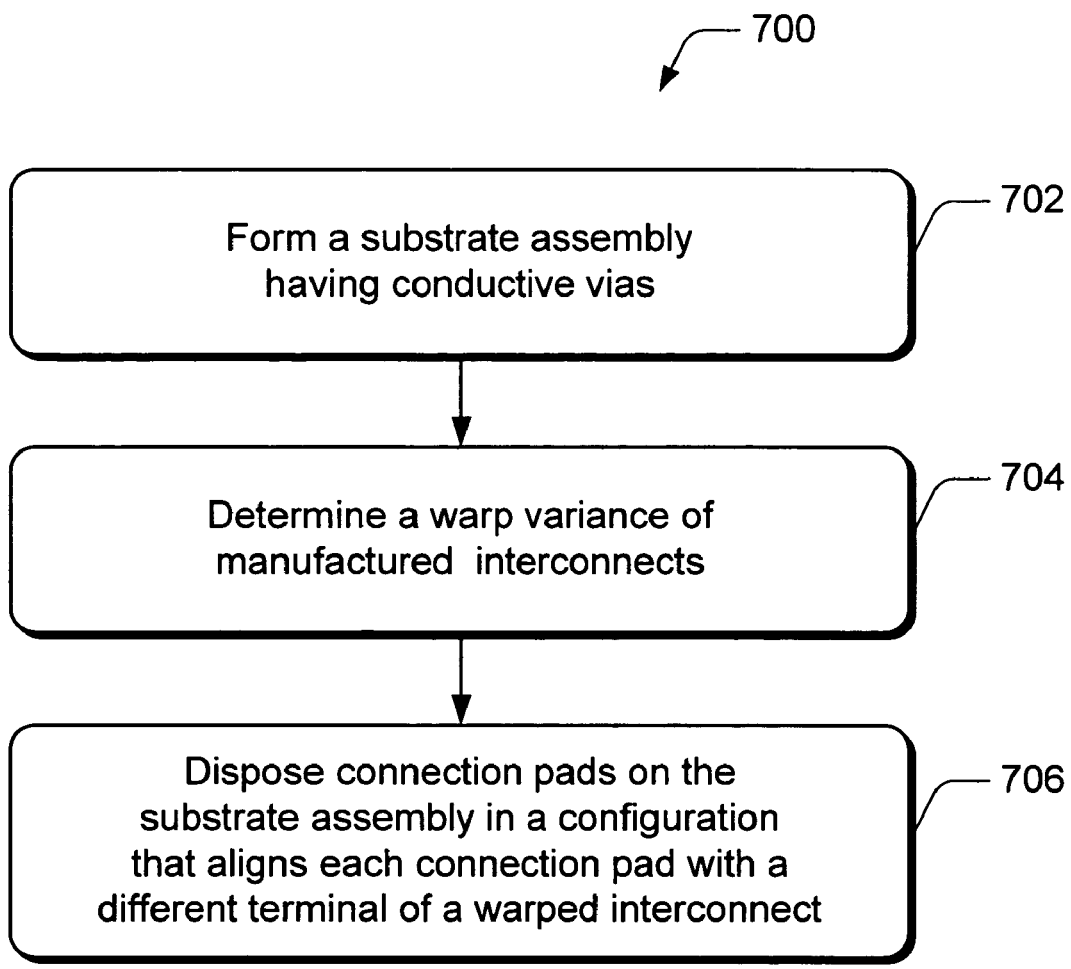
FIG. 7 is a flow diagram that illustrates one embodiment of a method of fabricating connection pads for connection to an interconnect that is warped or otherwise has a non-linear alignment of terminals.

FIG. 7 illustrates a method of fabricating connection pads for connection to an interconnect that is warped, or otherwise has a non-linear alignment of interconnect terminals (e.g., the interconnect terminals are not horizontally centered in a plane that is substantially normal to the surface of the interconnect). The order in which the method is described is not intended to be construed as a limitation, and any number of the described method blocks can be combined in any order to implement the method.

At block 702, a substrate assembly is formed having conductive vias. For example, substrate assembly 300 (shown in FIG. 3) can be formed with at least a surface 310, and can be formed as a multilayered ceramic substrate assembly with conductive vias.

At block 704, a warp variance of manufactured interconnects is determined. For example, warped interconnect 400 (shown in FIG. 4) has a warp variance 404 which is a resultant defect when the interconnect 400 is manufactured and/or fabricated. The warp variance 404 can be determined as a manufacturing tolerance, or deviation, by which connection pad layouts can be designed to accommodate warped interconnects.

At block 706, connection pads are disposed on the substrate assembly in a configuration that aligns each connection pad with a different terminal of a warped interconnect. For example, connection pads 304 and 308 (shown in FIG. 3) are disposed on substrate assembly 300 in a configuration of connection pad arrays 302 and 306, respectively. Connection pads 304 each align with a different interconnect terminal 402 (shown in FIG. 4) of the interconnect 400 such that the connection pads 304 couple an interconnect terminal 402 with a conductive via in the substrate assembly 300. The connection pads 304 and 308 can also be formed as solder pads each configured to form a soldered connection that electrically couples a terminal 402 of the interconnect 400 with a conductive via in the substrate assembly 300.

The connection pads 304 (shown in FIG. 3) are disposed on the substrate assembly 300 in the configuration according to the warp variance 404 (shown in FIG. 4) of interconnect 400. For example, connection pad array 302 is laid out with a warp variance 312 that substantially aligns with warp variance 404 of the interconnect 400. An interconnect can be warped at one end of the interconnect, or the interconnect can be warped at both ends such as interconnect 400 which is warped on a first end 406 and warped on a second end 408. The interconnect 400 is warped on both ends in a direction 410 that is parallel with surface 310 of the substrate assembly 300.

Further, connection pads 504 and 508 (shown in FIG. 5) are disposed on substrate assembly 500 in a configuration of connection pad arrays 502 and 506, respectively. One or more of the connection pads 504 are extended to each align with a different interconnect terminal 600 (shown in FIG. 6) of the warped interconnect 602 such that the connection pads 504 couple an interconnect terminal 600 with a conductive via in the substrate assembly 500. Any number of the connection pads 504 and/or 508 can be widened, or extended, on one or both sides to accommodate the interconnect terminals of an interconnect that may be warped.

Although connection pad layouts has been described in language specific to structural features and/or methods, it is to be understood that the subject of the appended claims is not necessarily limited to the specific features or methods described. Rather, the specific features and methods are disclosed as exemplary implementations of connection pad layouts.

The invention claimed is:

1. A connection assembly, comprising:
a substrate assembly; and
a plurality of connection pad arrays disposed on the substrate assembly in accordance with a predetermined warp variance of an interconnect to be connected to the connection assembly, the plurality of connection pad arrays form a configuration that connects each of the connection pads with a different terminal of the interconnect in multiple offset alignments that accommodate the interconnect being warped.

2. A connection assembly as recited in claim 1, wherein one or more of the connection pads are extended to each align with a different terminal of the warped interconnect.

3. A connection assembly as recited in claim 1, wherein one or more of the connection pads are extended to each align with a different terminal of the warped interconnect that is warped at a first end of the interconnect.

4. A connection assembly as recited in claim 1, wherein one or more of the connection pads are extended to each align with a different terminal of the warped interconnect that is warped at both a first end and a second end of the interconnect.

5. A connection assembly as recited in claim 1, wherein one or more of the connection pads has a center that is offset from a line in a direction parallel to a surface of the substrate assembly upon which the connections pads are disposed, the line being defined by a plane perpendicular to the surface of the substrate assembly.

6. A connection assembly as recited in claim 1, wherein the configuration of the connection pads aligns each connection pad with a different terminal of a warped end of the interconnect.

7. A connection assembly as recited in claim 1, wherein the connection pads are solder pads.

8. A connection assembly as recited in claim 1, wherein the substrate assembly is a multilayered ceramic substrate assembly.

9. A connection assembly as recited in claim 1, wherein the warped interconnect is configured to interface at least one of an integrated circuit and an electronic component with the substrate assembly.

10. A connection assembly as recited in claim 1, wherein:
the substrate assembly has at least a first surface upon which the connection pads are disposed; and
the warped interconnect is warped in a direction parallel with the first surface of the substrate assembly.

11. A connection assembly as recited in claim 1, wherein:
the substrate assembly has at least a first surface upon which the connection pads are disposed; and
a first end of the warped interconnect is warped in a direction parallel with the first surface of the substrate assembly.

12. A connection assembly as recited in claim 1, wherein:
the substrate assembly has at least a first surface upon which the connection pads are disposed; and
a first end and a second end of the warped interconnect are both warped in a direction parallel with the first surface of the substrate assembly.

13. A connection assembly, comprising:
a substrate assembly; and
connection pads disposed on the substrate assembly based on a warp variance of an interconnect to form a configuration that provides contact in multiple offset alignments between the connection pads and a different terminal of the interconnect caused by warping of the interconnect during manufacture of the interconnect such that a center of one or more of the connection pads is offset from a line in a direction parallel to a surface of the substrate assembly upon which the connection pads are disposed, the line being defined by a plane perpendicular to the surface of the substrate assembly.

14. A connection assembly as recited in claim 13, wherein each of the connection pads align with a different terminal of the interconnect that is at least one of warped at a first end of the interconnect and warped at both the first end and a second end of the interconnect.

15. A connection assembly as recited in claim 13, wherein the substrate assembly is a multilayered ceramic substrate assembly with conductive vias, and wherein the connection pads are solder pads each configured to form a soldered connection that electrically couples a terminal of the interconnect with a conductive via in the substrate assembly.

16. A connection assembly as recited in claim 13, wherein the interconnect is configured to interface at least one of an integrated circuit and an electronic component with the substrate assembly.

17. A connection assembly as recited in claim 13, wherein:
the substrate assembly has a first surface upon which the connection pads are disposed; and
the interconnect has non-linearly positioned terminals.

18. A substrate assembly, comprising:
conductive vias configured to electrically couple electronic components;
a first surface; and
connection pads disposed on the first surface to form a configuration based on a warp variance of an interconnect that is determined from manufacturing the interconnect such that each connection pad is configured to align with a different terminal of interconnect that is warped in a direction parallel with the first surface, the connection pads each configured to couple a different terminal of the interconnect with a conductive via.

19. A substrate assembly as recited in claim 18, wherein the connection pads are solder pads each configured to form a soldered connection that electrically couples a terminal of the interconnect with a conductive via.

* * * * *

UNITED STATES PATENT AND TRADEMARK OFFICE
CERTIFICATE OF CORRECTION

| | | |
|---|---|---|
| PATENT NO. | : 7,211,736 B2 | Page 1 of 1 |
| APPLICATION NO. | : 10/698604 | |
| DATED | : May 1, 2007 | |
| INVENTOR(S) | : Noah Lassar et al. | |

It is certified that error appears in the above-identified patent and that said Letters Patent is hereby corrected as shown below:

In column 8, line 20, in Claim 17, delete "tenninals" and insert -- terminals --, therefor.

Signed and Sealed this

Sixteenth Day of December, 2008

JON W. DUDAS
*Director of the United States Patent and Trademark Office*